United States Patent
Cheng

(10) Patent No.: US 8,825,449 B2
(45) Date of Patent: Sep. 2, 2014

(54) STRUCTURE AND METHOD OF DATA SYNCHRONIZATION FOR MULTI MEASURING APPARATUS

(75) Inventor: Chiu-Hao Cheng, New Taipei (TW)

(73) Assignee: Zeroplus Technology Co., Ltd, New Taipei (TW)

( * ) Notice: Subject to any disclaimer, the term of this patent is extended or adjusted under 35 U.S.C. 154(b) by 470 days.

(21) Appl. No.: 13/348,756

(22) Filed: Jan. 12, 2012

(65) Prior Publication Data

US 2012/0191418 A1      Jul. 26, 2012

(30) Foreign Application Priority Data

Jan. 12, 2011  (TW) .............................. 100101032 A

(51) Int. Cl.
| | | |
|---|---|---|
| G06F 15/00 | (2006.01) | |
| G01R 31/317 | (2006.01) | |
| G01R 31/319 | (2006.01) | |
| G01R 13/02 | (2006.01) | |
| G05B 19/042 | (2006.01) | |
| H04L 7/00 | (2006.01) | |

(52) U.S. Cl.
CPC .... *G01R 31/31726* (2013.01); *G01R 31/31922* (2013.01); *G01R 13/2018* (2013.01); *H04L 7/0012* (2013.01); *G01R 13/0254* (2013.01); *G05B 19/0426* (2013.01)
USPC ........... 702/189; 370/320; 370/318; 370/317; 370/335; 324/713

(58) Field of Classification Search
CPC ..................... G01R 31/31726; G01R 13/0254; G01R 13/0218; G01R 31/31922; G01R 31/31937; G01R 13/342; G05B 19/0426; G05B 2219/23446; H04B 7/022; H04B 1/7117; H04B 2201/70701; H04B 17/006; H04L 7/0012

USPC ................. 702/189; 370/320, 318, 317, 335; 324/713

See application file for complete search history.

(56) References Cited

U.S. PATENT DOCUMENTS

| | | | | |
|---|---|---|---|---|
| 3,742,290 | A  * | 6/1973 | Uchida ........................... | 327/93 |
| 4,566,093 | A  * | 1/1986 | Diaz .............................. | 370/248 |
| 6,804,636 | B2 * | 10/2004 | Senta et al. ..................... | 703/13 |
| 7,355,378 | B2 * | 4/2008 | Rottacker et al. ........... | 324/76.42 |
| 7,376,095 | B2 * | 5/2008 | Bae et al. ....................... | 370/320 |
| 7,920,601 | B2 * | 4/2011 | Andrus et al. ................ | 370/518 |
| 8,433,532 | B2 * | 4/2013 | LeBrun .......................... | 702/67 |
| 8,542,005 | B2 * | 9/2013 | Kharrati et al. ........... | 324/121 R |
| 2002/0022939 | A1 * | 2/2002 | Senta et al. ..................... | 702/123 |
| 2003/0039222 | A1 * | 2/2003 | Bae et al. ....................... | 370/320 |
| 2006/0114978 | A1 * | 6/2006 | Rottacker et al. ............. | 375/226 |
| 2010/0052653 | A1 * | 3/2010 | LeBrun ....................... | 324/76.47 |
| 2010/0057388 | A1 * | 3/2010 | LeBrun .......................... | 702/67 |
| 2011/0267036 | A1 * | 11/2011 | Kharrati et al. ........... | 324/121 R |

* cited by examiner

Primary Examiner — Carol S Tsai

(74) Attorney, Agent, or Firm — Chun-Ming Shih

(57) ABSTRACT

In a structure and a method of data synchronization for multi measuring apparatuses, the multi measuring apparatuses link together to expand channels. One of those apparatuses is a master control measuring apparatus, and others are slave measuring apparatus. The master measuring apparatus can output synchronous signal to the slave measuring apparatuses. The slave measuring apparatus can retrieve the synchronous signal as a mark of data synchronization, and the synchronous signal and the marks are further stored in a memory. All the data and marks stored in the memory of the measuring apparatuses are transferred to a processing platform. By the software installed in the processing platform, the data wave form length of the master control measuring apparatus and slave measuring apparatus can be adjusted to the same, and the problem caused by the clock error of the measuring apparatus can be solved as well.

12 Claims, 7 Drawing Sheets

STRUCTURE AND METHOD OF DATA SYNCHRONIZATION FOR MULTI MEASURING APPARATUS

BACKGROUND

1. Technical Field

Present invention relates to a structure or a method of data synchronization for multi measuring apparatuses, especially a data synchronization model and method for uniforming the different data wave form length of data retrieved by multi measuring apparatuses.

2. Related Art

The known measuring apparatus includes logical analyzer, oscilloscope, and mixed type oscilloscope, etc. Take the ordinary oscilloscope as an example: if an engineer needs to observe 8 bits signal at the same, it usually takes 4 times measuring separately when using 2-channel oscilloscope. By the increasing of the analyte signals, more measuring times are required, which are time consuming and not easy for analyzing the result. Moreover, it is not only to analyze the changing of wave form, but also to observe the changing of the timing.

Therefore, duo to the reasons mentioned above, engineers tend to use logical analyzer to do the observing. User is able to set the trigger criteria of the common logical analyzer, and comparing the analyte signal with the trigger criteria. When the analyte signal is the same as the trigger criteria, the logical analyzer will show the events happened by the time of triggering, and so do the events happened before and after the triggering, on a monitor. Otherwise, the events will not be shown on the monitor. Hence, the logical analyzer can not only show a digital wave form immediately, but also easy for observing the timing, and engineers will no longer need pens and paper to obtain the sampling signal.

For those reasons stated above, different measuring apparatuses have different purposes, but all of them have the same drawback. The drawback is that the clocks of different measuring apparatuses are slightly different, which are about 1-50 clock(s) different per million clocks, depending on the inaccuracy standard of every apparatuses. Therefore, by the extending of sampling time, it will lead to tremendous errors for the result data when a plurality of logical analyzers connected to each other to expend channels. Thus, it is not feasible under the traditional technology to use a plurality of measuring apparatuses to do the data synchronous processing.

As a result, providing a structure and a method of data synchronization for multi measuring apparatuses can be a best solution for synchronizing the different data wave form length of a plurality of different measuring apparatuses. By the software provided from present invention, the different data wave form length of a plurality of different measuring apparatuses can be adjusted to the same.

BRIEF SUMMARY

Present invention relates to a structure or a method of data synchronization for multi measuring apparatuses. Present invention can eliminate the clock error which cause the sampling data inconsistency of a plurality of measuring apparatuses, and also adjusts the data synchronization problem for multi measuring apparatuses.

Present invention further enables a plurality of measuring apparatuses to link to each other for channel expending, wherein one of the measuring apparatus is a master control measuring apparatus, while others are slave measuring apparatuses. The master measuring apparatus can output synchronous signal to the slave measuring apparatuses. The slave measuring apparatus can retrieve the synchronous signal as a mark of data synchronization, and the synchronous signal and the marks are further stored in a memory. All the data and marks stored in the memory of the measuring apparatuses are transferred to a processing platform. The software installed in the platform can compare the data length between the marks of master control measuring apparatuses and the slave measuring apparatus and calculates the ratio of said data length. The software can further adjust the data wave length of the slave measuring apparatus to the same as the master control measuring apparatus. Thus, sampling data length inconsistency caused by the clock error of the measuring apparatus can be solved thoroughly.

The preferred embodiment of the measuring apparatus of present invention is logical analyzer, oscilloscope, or mixed type oscilloscope, etc. The measuring apparatuses can be of different attribute, and can be connected to each other.

The measuring apparatus includes a controlling/sampling data transport terminal 11, a clock generator 12, a synchronous signal input/output unit 13, a triggering signal input/output unit 14, a sampling-start signal input/output unit 15, a sampling unit 16, a synchronous/triggering tag generating unit 17, a memory controller 18, and a memory device 19.

The synchronous signal generated by the master control measuring apparatus is provided to the slave measuring apparatus to do the data synchronization, and the synchronization period is a specific periodic square wave signal, wherein the square wave signal period should larger than the integer multiple of the sampling signal period of the master control measuring apparatus.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
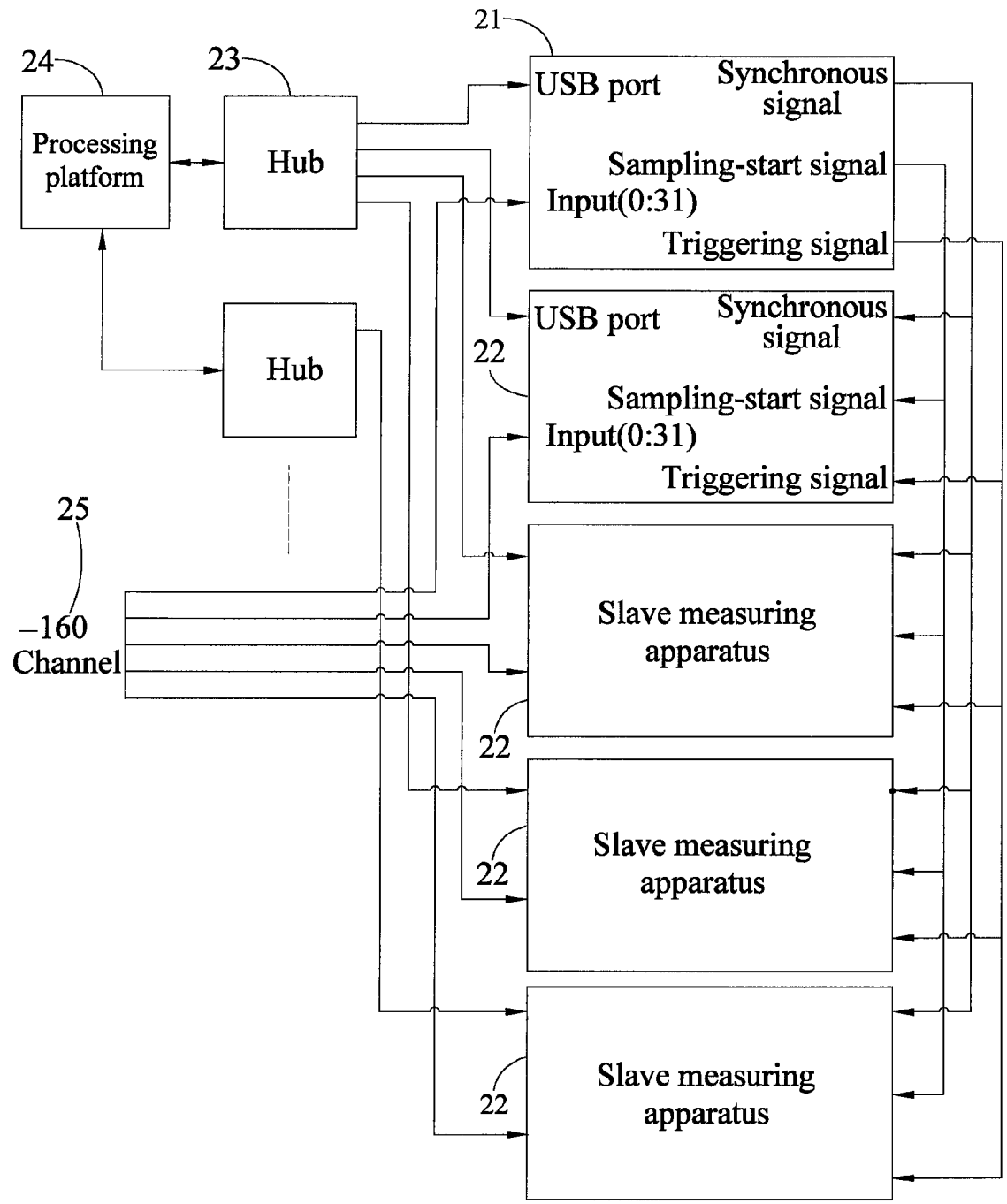
FIG. 1 is a whole framework diagram of the present invention.

FIG. 1 is a schematic diagram of present invention, which includes master control measuring apparatus 21, slave measuring apparatus 22, hub 23, processing platform 24, and analyte data source 25. The master control measuring apparatus 21 has a sampling-start signal terminal, a synchronous signal terminal, a triggering signal terminal, a signal input terminal, and an USB port (connecting port). The synchronous signal terminal can generate a synchronous signal; the triggering signal terminal can generate a triggering signal; and the sampling-start signal terminal can generate a start sampling signal. The master control measuring apparatus 21 and slave measuring apparatus 22 are connected to the processing platform 24 via the hub 23, but the measuring apparatuses 21 and 22 can also connect to platform without hub 23. For example, if the processing platform 24 is a personal computer which has 3 USB ports on it, the measuring apparatuses 21 and 22 can directly connect to the personal computer if the number of the measuring apparatuses 21 and 22 are fewer than 3.

The slave measuring apparatuses 22 are connected to the master control measuring apparatus 21. The slave measuring apparatus 22 also has a sampling-start signal terminal, a synchronous signal terminal, a triggering signal terminal, a signal input terminal, and an USB port (connecting port). The synchronous signal terminal of the master control measuring apparatus 21 can transfer the synchronous signal to the synchronous signal terminal of the slave measuring apparatus 22, and the triggering signal terminal of the master control measuring apparatus 21 can transfer the triggering signal to the triggering signal terminal of the slave measuring apparatus 22. The sampling-start signal terminal of the master control measuring apparatus 21 can transfer the start sampling signal to the sampling-start terminal of the slave measuring apparatus 22. The synchronous signal terminal of the master control measuring apparatus 21 transfer the synchronous signal to the synchronous signal terminal of the slave measuring apparatus 22 to make every measuring apparatuses generate the marks of the synchronous signal, and said marks are being stored in the memory device of every measuring apparatuses.

Figure 2:
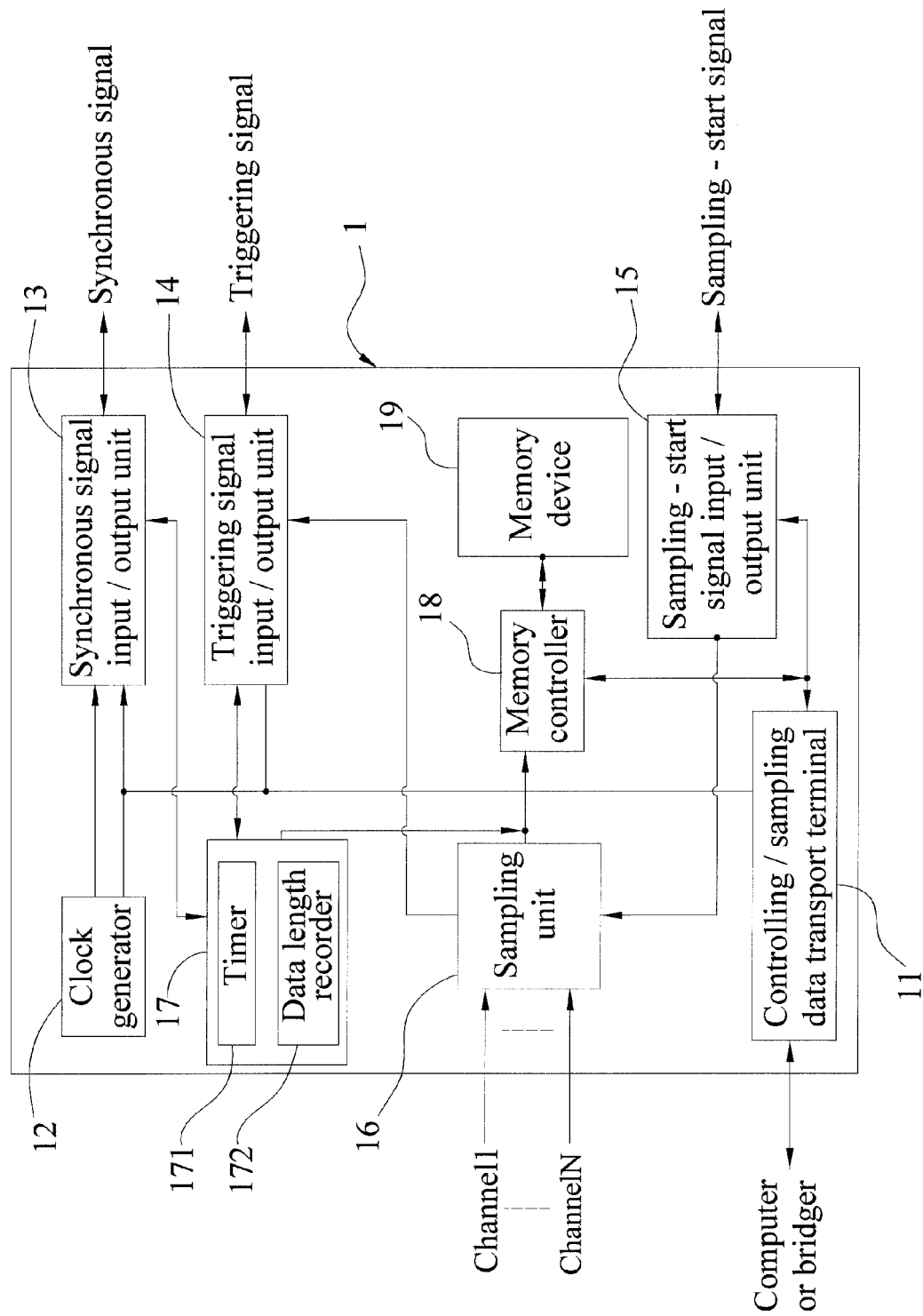
FIG. 2 is a structure diagram of the measuring apparatus of the present invention.

The triggering signal terminal of the master control measuring apparatus 21 can output a signal of detected triggering data to the slave measuring apparatus 22 for storing the mark of the triggering position. The master control measuring apparatus 21 and the slave measuring apparatus 22 are logical analyzers, and the detail structure is illustrated as FIG. 2. The measuring apparatuses 21 and 22 can be logical analyzer, oscilloscope, or mixed type oscilloscope, etc., and every single measuring apparatuses can connect each other with different attribute, such as logical analyzer, oscilloscope, or mixed type oscilloscope, etc. The amount of the measuring apparatus can increase or decrease depending on the number of the channel.

The hub 23 is connected to the USB port of the master control measuring apparatus and the slave measuring apparatus, respectively, to transfer the data of the master control measuring apparatus 21 and the slave measuring apparatus 22. In one embodiment of present invention, the master control measuring apparatus 21 and the slave measuring apparatus 22 are logical analyzers, and each of them uses the USB port to transfer the data and connect to each other. The measuring apparatus of present invention is not limited to logical analyzer, and the connecting port of the measuring apparatus can be altered if necessary, not limited to USB port as well.

The preferred embodiment of the processing platform 24 is a personal computer, which is connected to the master control measuring apparatus 21 and slave measuring apparatus 22 by the hub 23. The hub 23 can transfer the data and mark stored in the master control measuring apparatus 21 and slave measuring apparatus 22 to the processing platform 24. The processing platform 24 contains software which can be used to compare the sampling data between the synchronous signal marks of the master control measuring apparatus 21 and the slave measuring apparatus 22, and calculates the ratio of the sampling data. The software can also adjust the wave form length of the slave measuring apparatus 22 to the same as the wave form length of the master control measuring apparatus 21.

The analyte data source 25 is connected to the signal input terminal of the master control measuring apparatus 21 and the slave measuring apparatus 22 to make the master control measuring apparatus 21 and the slave measuring apparatus 22 to do the data sampling.

For those stated above, the synchronous signal terminal, the triggering signal terminal, and the signal input terminal of the master control measuring apparatus 21 and the slave measuring apparatus 22 can connect to each other by the connection of the USB port. In the present embodiment, the master control measuring apparatus 21 outputs a synchronous signal to the slave measuring apparatus 22 to make the slave measuring apparatus 22 use the synchronous signal as the mark of the data synchronization, and the synchronous signal is stored in the memory device of the slave measuring apparatus 22. Afterward, all the data and marks stored in the memory of the foresaid apparatuses are transferred to the processing platform 24, wherein the software installed in the processing platform 24 can compare and calculate the ratio of the sampling data length between the synchronous signal of the master control measuring apparatus 21 and the slave measuring apparatus 22. By using the software, the wave form length of the slave measuring apparatus 22 can be adjusted to the same as the wave form length of the master control measuring apparatus 21. Therefore, the sampling data length different that caused by the clock error of the measuring apparatus can also be solved.

In the embodiment of present invention, the master control measuring apparatus 21 and the slave measuring apparatus 22 are logical analyzers, which includes controlling/sampling data transport terminal 11, clock generator 12, synchronous signal input/output unit 13, triggering signal input/output unit 14, sampling-start signal input/output unit 15, sampling unit 16, synchronous/triggering tag generating unit 17, memory controller 18, and memory device 19. After connecting a plurality of measuring apparatuses, users can set up a specific measuring apparatus as the master control measuring apparatus 21 and make other slave measuring apparatuses to do the sampling data comparison. The inconsistency of the sampling data length caused by the clock error of the measuring apparatus can be solved accordingly.

The logical analyzer of this embodiment is introduced as follows:

The controlling/sampling data transport terminal 11, the clock generator 12, the synchronous signal input/output unit 13, the triggering signal input/output unit 14, the sampling-start signal input/output unit 15, and the memory controller 18 are electrically connected. The controlling/sampling data transport terminal 11 connect a external computer, a bridge, or the hub 23 to control and transfer data among all the devices.

The clock generator 12 is electrically connected to the controlling/sampling data transport terminal 11 and the synchronous signal input/output unit 13. The sampling clock signal that used for sampling can be set by the users on the clock generator 12 to provide other measuring apparatuses doing the data sampling process.

The synchronous signal input/output unit 13 is electrically connected to the controlling/sampling data transport terminal 11, the clock generator 12, and the synchronous/triggering tag generating unit 17. The synchronous signal input/output unit 13 can receive the sampling clock signal generated by the clock generator 12, and further generates the synchronous signal and output to other measuring apparatuses. Besides, the synchronous signal input/output unit 13 of the master control measuring apparatus 21 will transfer a synchronous signal to the synchronous signal input/output unit 13 of the slave measuring apparatus 22.

The triggering signal input/output unit 14 is electrically connected to the controlling/sampling data transport terminal 11, the sampling unit 16, and the synchronous/triggering tag generating unit 17. The triggering signal input/output unit 14 can receive the external triggering signal, or detects the sampling data and then generates triggering signal to output to other measuring apparatuses to record the triggering data position. The triggering signal input/output unit 14 of the master control measuring apparatus 21 will transfer a triggering signal to the triggering signal input/output unit 14 of the slave measuring apparatus 22 to form a mark of signal triggering criteria.

The sampling-start signal input/output unit 15 is electrically connected to the controlling/sampling data transport terminal 11 and the sampling unit 16. The sampling-start signal input/output unit 15 can receive the external sampling-start signal to control other measuring apparatuses to do the sampling synchronously. The sampling-start signal input/output unit 15 of the master control measuring apparatus 21 will transfer a start sampling signal to the sampling-start signal input/output unit 15 of the slave measuring apparatus 22 to inform the slave measuring apparatus 22 can start to do the signal sampling.

The sampling unit 16 is electrically connected to a plurality of triggering signal input/output unit 14, the sampling-start signal input/output unit 15, and the memory controller 18. The sampling unit 16 can provide a plurality of channels for data input, and the sampling unit 16 will start to do the data sampling right after receiving the start sampling signal. The sampling data will be transferred to the memory controller 18 and stored in the memory device 19. The sampling unit 16 also provides sampling data to the triggering signal input/output unit 14 to detect the triggering criteria.

The synchronous/triggering tag generating unit 17 includes a timer 171 and a data length recorder 172, and is electrically connected to the synchronous signal input/output unit 13, the triggering signal input/output unit 14, and the memory controller 18. When the data sampling starts, the master control measuring apparatus 21 outputs the synchronous signal to the slave measuring apparatus 22. The timer 171 will record a count of the sampling time as a time mark, and the data length recorder 172 will record the data length when the data remain unchanged. When the master control measuring apparatus 21 detects the upper edge of the wave of the synchronous signal terminal, the instant time mark and the length of the former changed data will be both stored in the sampling data as the mark of the synchronous signal, and further stored in the memory device 19. Besides, the master control measuring apparatus 21 will output the synchronous signal to the slave measuring apparatus 22, and the synchronous/triggering tag generating unit 17 of the slave measuring apparatus 22 receives the synchronous/triggering signal of the master control measuring apparatus 21. The inner data, time marks, data wave form length of the synchronous/triggering signal of the master control measuring apparatus 21 will be integrated as the mark of synchronous/triggering, and stored in the memory device 19.

The memory controller 18 is electrically connected to the controlling/sampling data transport terminal 11, the sampling unit 16, the synchronous/triggering tag generating unit 17, and the memory device 19. The memory device 19 has a plurality of data-writing sections, and the writing and reading of the data-writing sections are controlled by the memory controller 18. The memory controller 18 can receive the sampling data and the synchronous/triggering mark, and stores them in the memory device 19, or reads the data in the memory device 19, in order to provide data to the controlling/sampling data transport terminal 11 to transfer to the platform 24.

Figure 3:
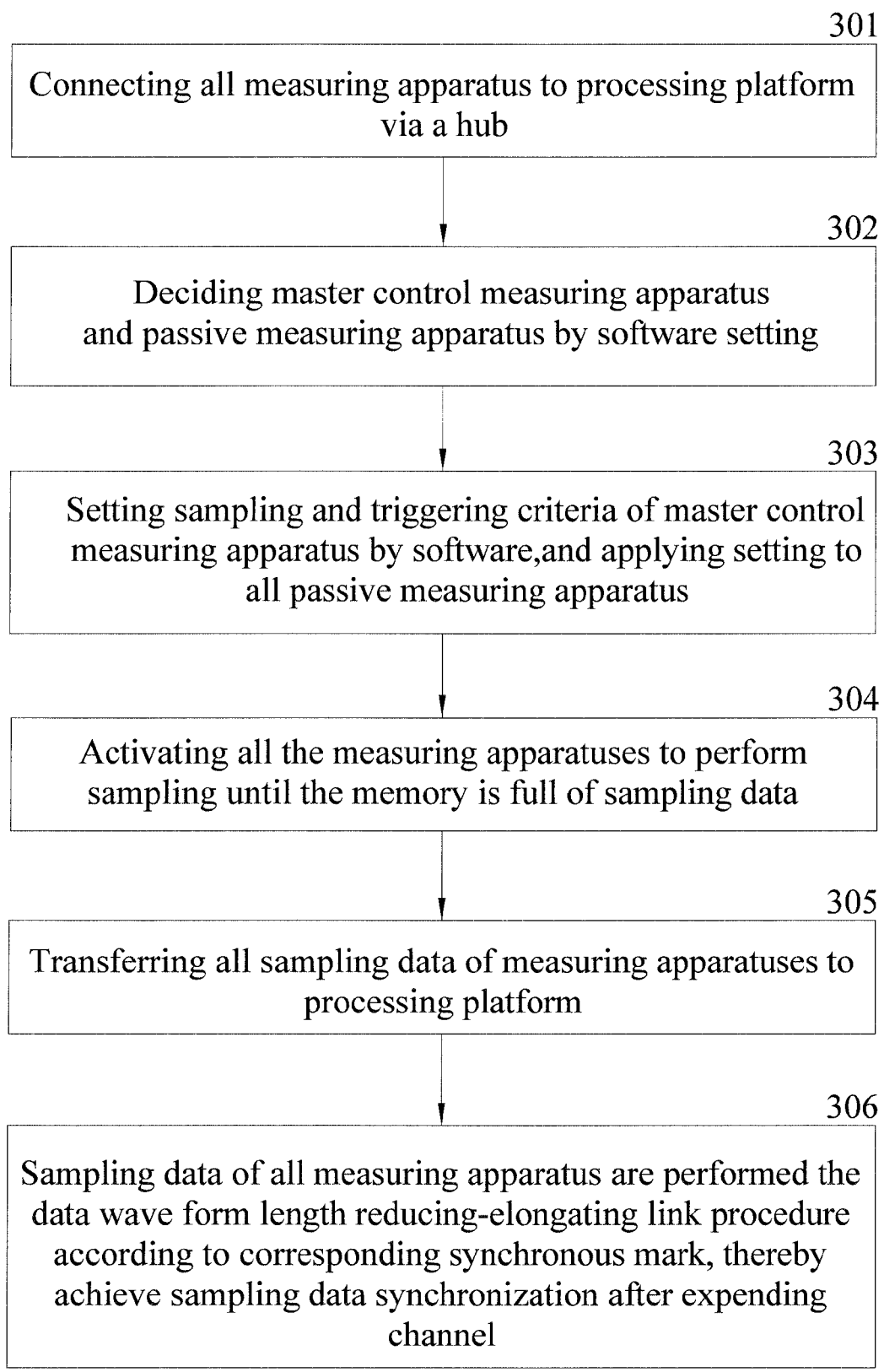
FIG. 3 is a data synchronization process diagram of the present invention.

Regarding the operation method for the present invention, please refers to FIG. 3. The framework of the operation method please refers to FIG. 1. The operation procedure is as follows:

1. First of all, users connect the synchronous signal terminal of the master control measuring apparatus with the synchronous signal terminal of the slave measuring apparatus. All measuring apparatuses can connect to the processing platform 24 via the hub 23, and thus the synchronous signal terminal, sampling-start signal terminal, and the triggering signal terminal of the master control measuring apparatus 21 and the slave measuring apparatus 22 are connected to each other.

2. By the software installed in the processing platform 24, users can set up one of the measuring apparatuses as the master control measuring apparatus 21, and set up other measuring apparatuses as the slave measuring apparatuses 22.

3. Use the software of the processing platform 24 to set up the sampling and triggering criteria for the master control measuring apparatus 21, and further apply the same setting on all the slave measuring apparatuses 22. The sampling and triggering criteria setting procedures are labeled as number (303):

(a) Set up the synchronous signal period of the master control measuring apparatus 21 (can be integral multiple period of the sampling clock period). The rate of the period is set by the users, and this makes a suitable amount of synchronous marks to use, and also avoids using too much memory space. The setting and the way of implementation of the synchronous signal and the sampling clock are illustrated in the following embodiment.

(b) Users can set up the triggering signal output criteria of the master control measuring apparatus 21 according to their need.

4. Activate the master control measuring apparatus 21 to send out the sampling-start signal, and all the slave measuring apparatuses will be activated to do the data sampling. All the synchronous signals sampled by the measuring apparatuses can generate the synchronous marks by detecting the electric potential turning from low to high. All the synchronous marks are stored in the memory device 19 until the memory is full, which means the sampling process is done (304).

5. Transfer the sampling data of the master control measuring apparatus 21 and the slave measuring apparatus 22 to the processing platform 24. Access all the data stored in the memory device of the master control measuring apparatus 21 and the slave measuring apparatus 22 through the processing platform 24 (305).

6. By the corresponding synchronous marks, the sampling data of the master control measuring apparatus 21 is compared to the slave measuring apparatus 22. Calculate the ratio of the sampling data of the master control measuring apparatus 21 and the slave measuring apparatus 22, and adjust the data wave form of the slave measuring apparatus 22 by the wave form length elongation-shortening calculation. After the calculation process is completed, the sampling data synchronization after the channel expending is completed (306). The detail calculation process is as follows:

(a) Calculate all the data between the synchronization marks of the slave measuring apparatus 22 by the processing platform 24. According to the data size between all the marks of the slave measuring apparatus 22, the data size of the master control measuring apparatus 21 is compared with the data of the slave measuring apparatus 22, and the ratio of the data will be calculated.

(b) Shorten or elongate the wave form length of the slave measuring apparatus 22 according to the ratio of all the marks in the processing platform 24 to match the data wave length between the marks of the master control measuring apparatus.

(c) Through the processing platform 24, according to the time axis of the synchronous mark of the master control measuring apparatus 21, the adjusted data wave form length of the slave measuring apparatus is operated to link to the desired length. After the linking operation is done, a complete data wave form of the data synchronous processing can be obtained.

The linking of the wave form length can be accomplished by the cartography software installed on the processing platform 24. The cartography software aligns all the adjusted data wave form length to the time axis of the measuring clock of the master control measuring apparatus 21 by the data wave form length between the synchronous marks, and shows them on a monitor.

Figure 4:
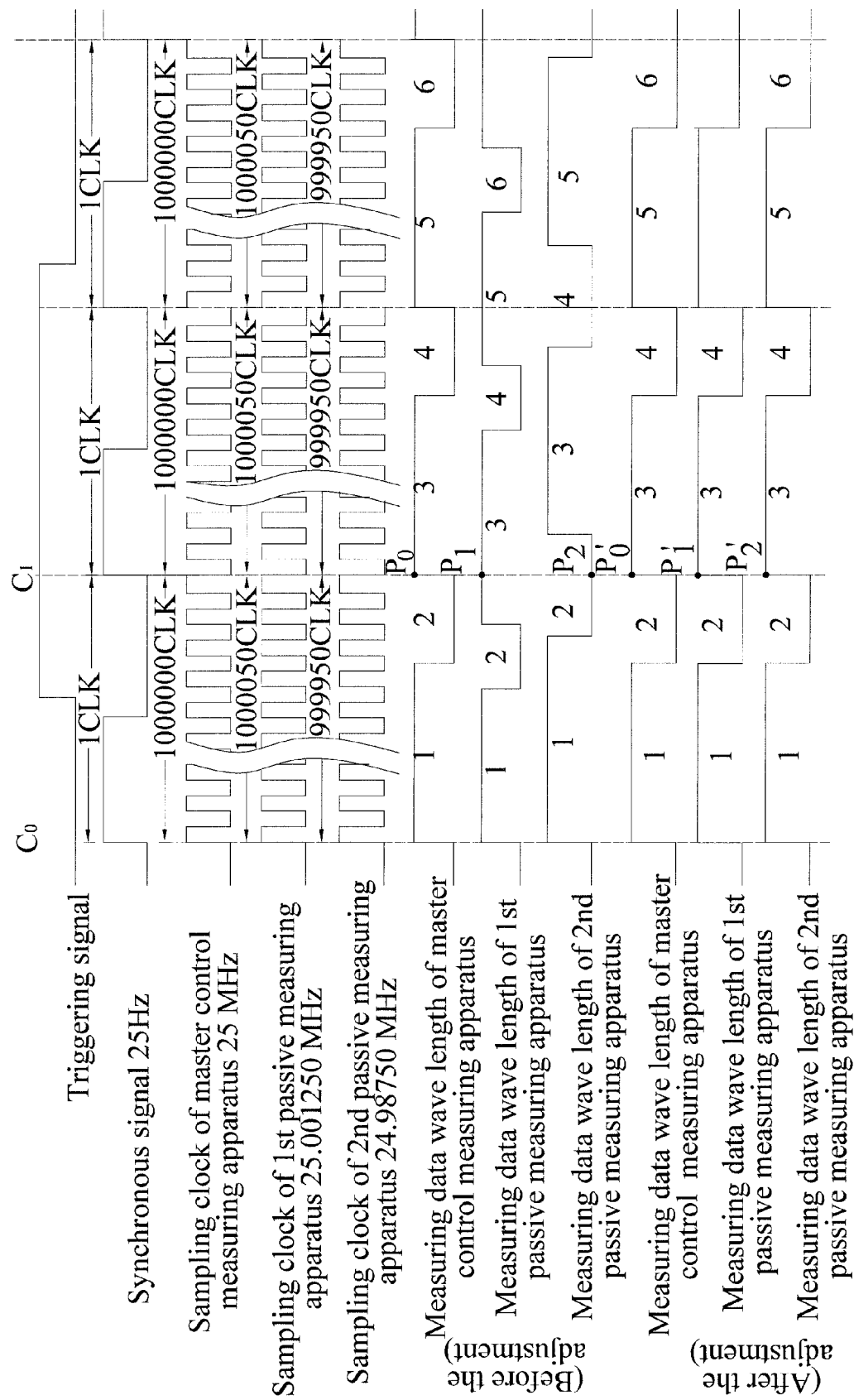
FIG. 4 is a schematic diagram of sampling data synchronization for multi measuring apparatuses of the present invention.

Referring to FIG. 4, which is a schematic diagram of sampling data synchronization for multi measuring apparatuses of the present invention. In the present embodiment, a master control measuring apparatus 21 and two slave measuring apparatuses 22 are used to connect each other to operate the sampling data synchronous processing. The hardware configuration of multi measuring apparatuses can be seen on FIG. 1. In the present embodiment, only two slave measuring apparatuses 22 are used to illustrate the operation, and the number of the slave measuring apparatus can vary on demand.

Assume that the clock of every measuring apparatuses are 25 MHz, and the error value of the master control measuring apparatus, the first, and the second slave measuring apparatuses are 0 ppm, +50 ppm, and −50 ppm (ppm. parts per million, and the +50 ppm means 50 extra units per million units). Therefore, the clock for every single clock is 25 MHz/1M=25 Hz, so the clock errors of said measuring apparatuses are 25*0=0 Hz, 25*50=1250 Hz, and 25*−50=−1250 Hz, respectively. After the unit conversion, it is known that the actually clock for said apparatuses are 25.000000 MHz, 25.001250 MHz, and 24.998750 MHz, respectively.

User set up one of the measuring apparatuses as the master control measuring apparatus 21 through the processing platform 24, which can be personal computer or other devices having calculation ability. The other two measuring apparatuses are the first slave measuring apparatus and the second slave measuring apparatus, respectively. User set up the sampling frequency as 25 MHz for all of the measuring apparatuses, and the synchronous signal is the sampling frequency of the master control measuring apparatus 21 divided by their rate. The rate can be decided by the user, thus the rate can be replaced by a random integer "N". In the present embodiment, the rate is assumed as 1M, so the actual synchronous signal is 25.000000 MHz/1M, which is 25.000000 Hz.

Therefore, duo to the different sampling frequency of every measuring apparatuses, the section produced by the ascending edge of the synchronous signal will be different as well. The master control measuring apparatus 21 obtains 1M (25.000000 MHz/25.000000 Hz) sampling data. However, the clock of the first slave measuring apparatus is 25,001250 MHz, which makes the first slave measuring apparatus obtain 1000050 (25.001250 MHz/25.000000 Hz) sampling data, which is 50 sampling data more than the master control measuring apparatus. The second slave measuring apparatus only obtains 999950 (24.998750 MHz/25.000000 Hz) sampling data, which is 50 sampling data less than the master control measuring apparatus. As we can see from the FIG. 4, before the adjustment apply, du to the different sampling data, the sampling wave form of the master control measuring apparatus 21, the first slave measuring apparatus, and the second slave measuring apparatus, are not the same. (FIG. 4, before the adjustment, the wave form of numbers 1-6 are not the same).

Referring to FIG. 4, the sampling rate of the master control measuring apparatus 21 set by the present embodiment is 1M (1,000,000), which means the data length between the two synchronous marks ($C_0, C_1$) of the master control measuring apparatus 21 is 1,000,000 sampling data (CLK). $P_0$ marked in FIG. 4 represents the sampling rate of the master control measuring apparatus 21 is 1M. By the assumption of present embodiment, the data length between the two marks of the first slave measuring apparatus is 1,000,050 CLK. The first slave measuring apparatus has 50 sampling data more than the master control measuring apparatus, which means the sampling rate of $P_1$ in FIG. 4, where the wave form has not yet been adjusted, is 1,000,050. Therefore, the sampling rate of the every sampling wave forms between the two synchronous marks ($C_0, C_1$) should be adjusted. When adjusting the sampling wave form, every wave forms that sampled by the first slave measuring apparatus should times 1M (the rate of sampling of the master control measuring apparatus)/1000050 (the sampling rate of the first slave measuring apparatus) to make the adjusted sampling rate $P_1'$ of the first slave measuring apparatus the same as the sampling rate $P_0$ of the master control measuring apparatus 21. Duo to 50 sampling data less than the master control measuring apparatus 21, the wave form unadjusted sampling rate $P_2$ in FIG. 4 for the second slave measuring apparatus is 999,950. Therefore, every wave forms that sampled from the second slave measuring apparatus should times 1M (the sampling rate of the master control measuring apparatus)/999950 (the sampling rate of the second slave measuring apparatus), which is about 1.00005 times the wave form length. After the adjustment, the sampling rate $P_2'$ will be the same as the sampling rate $P_0$ of the master control measuring apparatus 21. As we can see from the wave form ratio and length adjustment portion in FIG. 4, all the data of the slave measuring apparatus 22 are compared with the data length between the two marks of the master control measuring apparatus 21 by the data length between the two marks ($C_0, C_1$). The data wave form length of the slave measuring apparatus 22 is reduced or elongated to be the same wave length as the master control measuring apparatus 21 (FIG. 4, the adjusted wave form numbers 1-6, the wave forms of the first slave measuring apparatus and the second measuring apparatus are the same as the wave form of the master control measuring apparatus 21). Finally, the wave form lengths of the first and second slave measuring apparatuses are linked according to the time axis of the synchronous mark of the master control measuring apparatus 21, and the multi measuring apparatuses data synchronous processing is complete.

Figure 5:
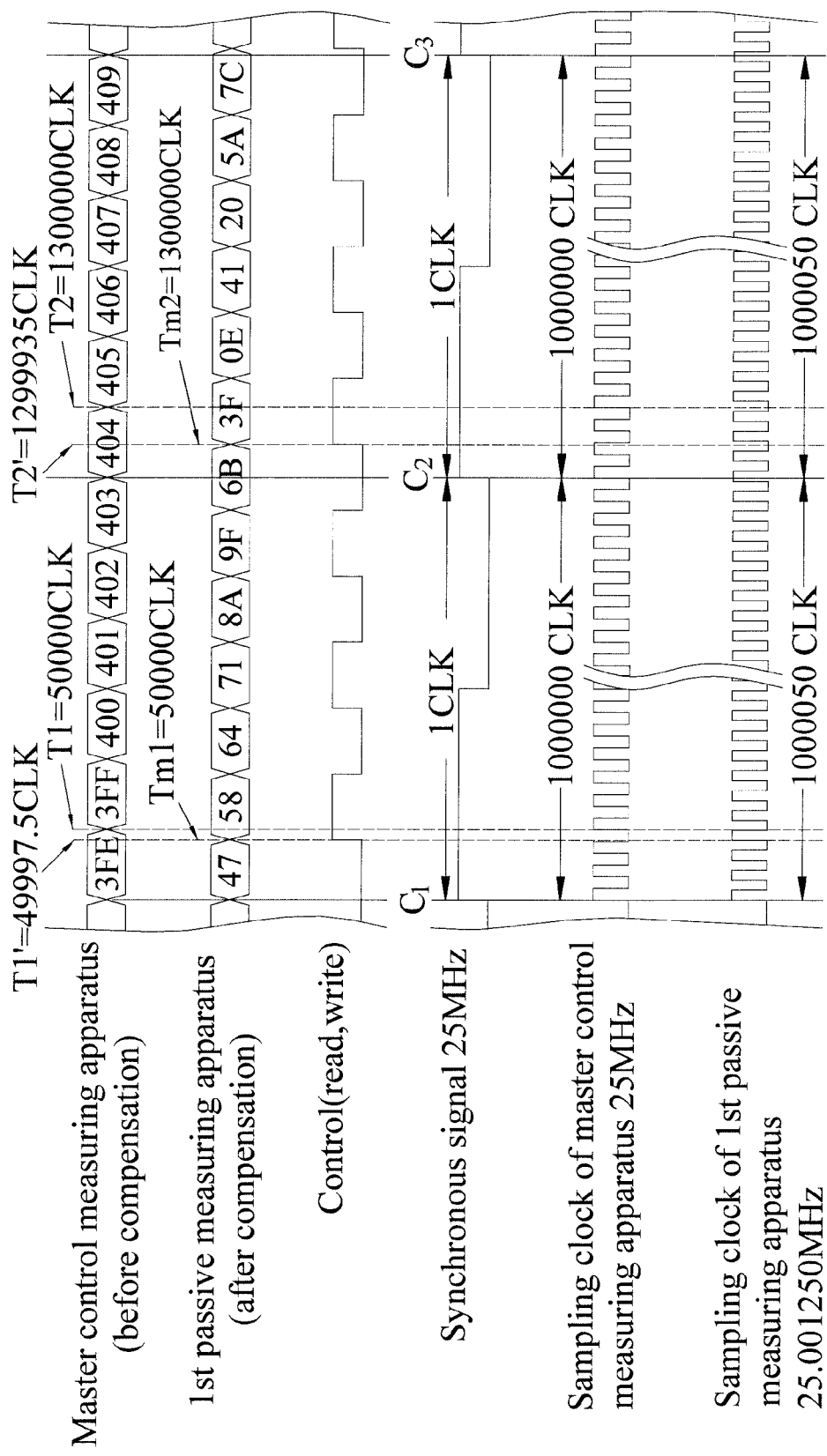
FIG. 5 is a schematic diagram before the wave form compensation of the present invention.
Figure 6:
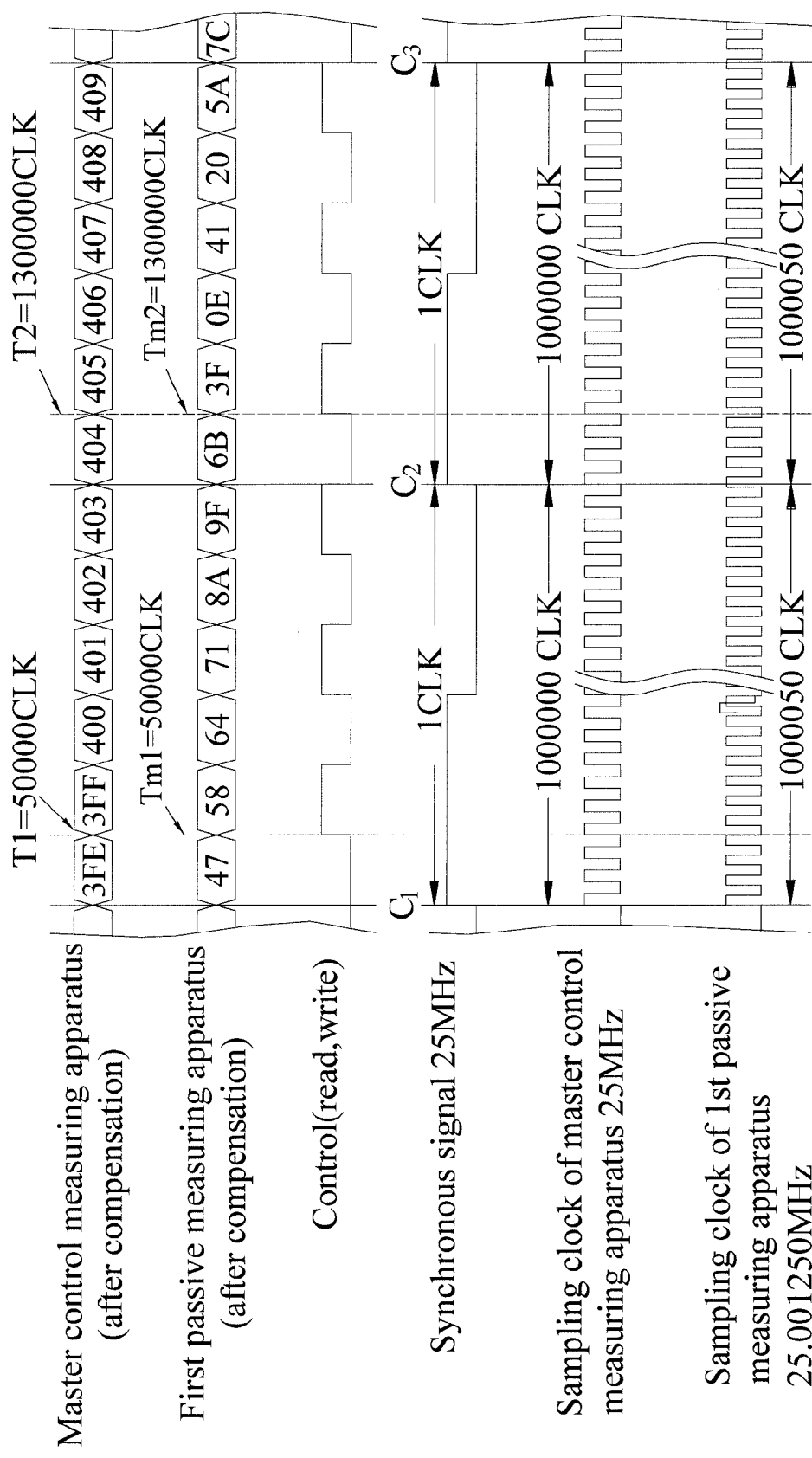
FIG. 6 is a schematic diagram after the wave form compensation of the present invention.

By the increasing of the sampling time, the error of the result data will become obvious. Data synchronous processing for multi measuring apparatuses can not be achieved if the wave form can not be adjusted or compensated by present invention. FIG. 5 and FIG. 6 are the schematic diagrams of the wave form pre-compensation and wave form post-compensation. In FIG. 5 and FIG. 6, the illustration only focus on the wave form compensation of the master control measuring apparatus 21 and the first slave measuring apparatus, and the operation methods of the other slave measuring apparatuses are the same as the illustration of FIG. 5 and FIG. 6. In the present embodiment, select two time points $T_1$ (50,000 CLK)

and $T_2$ (1,300,000 CLK) to illustrate the fact that the longer the sampling time, the bigger the data error, and also explain the wave form compensation according to the difference of the sampling data size.

Assume that the sampling rate is 1M, the clock of every synchronous signal is 25 Hz, and the clock of the master control measuring apparatus is 25.000000 MHz, which means there are 1,000,000 sampling signals included between the two synchronous marks. There are 3 synchronous marks ($C_1$, $C_2$, $C_3$) labeled in FIG. 5 and FIG. 6. For the master control measuring apparatus 21, the synchronous mark $C_1$ is the start of performing the data sampling, and there are 1,000,000 sampling data between the $C_1$ and the next co-mark $C_2$. Likewise, there are also 1,000,000 sampling data between the $C_2$ and $C_3$. The clock of the first slave measuring apparatus is 25.001250. Because the higher sampling rate of the slave measuring apparatus than of the master control measuring apparatus 21, the first slave measuring apparatus will have 50 extra sampling data than the master control measuring apparatus 21. Therefore, there are 1,000,050 sampling data included between the two synchronous marks ($C_1$, $C_2$) or ($C_2$, $C_3$), which means the sampling rate of the first slave measuring apparatus is faster than the master control measuring apparatus 21.

Take two time points $T_1$ (50,000 CLK) and $T_2$ (1,300,000 CLK) for discussion. Owing to the faster sampling rate of the first slave measuring apparatus, for the time point 50000 CLK, the time point that the first slave measuring apparatus complete sampling 50000 CLK (represented as $Tm_1$=50,000 CLK and $Tm_2$=1,300,000 CLK in FIG. 5 and FIG. 6) will be earlier than the 50000 CLK sampling point $T_1$ and $T_2$ of the master control measuring apparatus 21.

When the first slave measuring apparatus reach the time point $Tm_1$ and $Tm_2$, the master control measuring apparatus 21 has not yet reach the sampling time point $T_1$ and $T_2$. The corresponding sampling point in FIG. 5 is presented as $T1'$ and $T2'$, and the error can be calculated by the following equation:

$$T_1 = 50000\ CLK, A = 1M = 1000000\ CLK, C_1 = 0\ CLK,$$
$$C_2 = 1000050\ CLK$$

The error constant is $R = (A/(C_2 - C_1)) = 1000000/(1000050-0) = 0.99995$

In the present embodiment, the error constant R is acquired by comparing the sampling rate of the master control measuring apparatus 21 with the ratio between the two marks ($C_2$, $C_1$) or ($C_3$, $C_2$) of the slave measuring apparatus. For setting the marks, user can decide the size of the section, and is not limited to the present example.

$$T_1' = T_1 \times R = 50000 \times 0.99995 = 49997.5\ (CLK)$$

For the same theory, $$T_2 = 1300000\ CLK, A = 1M = 1000000\ CLK,$$
$$C_2 = 1000050\ CLK, C_3 = 2000100\ CLK$$

$$R = (A/(C_3 - C_2)) = 1000000/(2000100 - 1000050) = 0.99995$$

$$T_2' = T_2 \times R = 1300000 \times 0.99995 = 1299935\ (CLK);$$

The error value calculated by the above equation is 2.5 CLK and 65 CLK, respectively, which means that the first slave measuring apparatus samples 50,000 CLK at the time that the master control measuring apparatus 21 samples 49997.5 CLK ($T_1'$) and 1,299,935 CLK ($T_2'$). The result shows that when the first slave measuring apparatus samples 50,000 CLK, the master control measuring apparatus 21 only samples 49997.5 CLK ($T_1'$); when the first slave measuring apparatus samples 1,300,000 CLK ($Tm_2$), the master control measuring apparatus 21 only samples 1,299,935 CLK ($T_2'$). Therefore, the error increases with the increasing of the sampling time. The error can be adjusted by adjusting the wave form as shown in the foresaid example, and the wave form of the slave measuring apparatus can be adjusted according to the sampling rate of the master control measuring apparatus 21. The schematic diagram of the adjusted wave form is shown in FIG. 6. By the adjusting method of the present invention, no matter how many measuring apparatuses are connected, adjusting a plurality of measuring apparatuses at the same time can be achieved once the sampling ratio of the master control measuring apparatus 21 and the slave measuring apparatus is obtained. The wave form of the slave measuring apparatus 22 can be adjusted according to the ratio of the sampling rate of the master control measuring apparatus 21 and the slave measuring apparatus 22, and the purpose that data synchronization of multi measuring apparatuses can be achieved as well.

Figure 7:
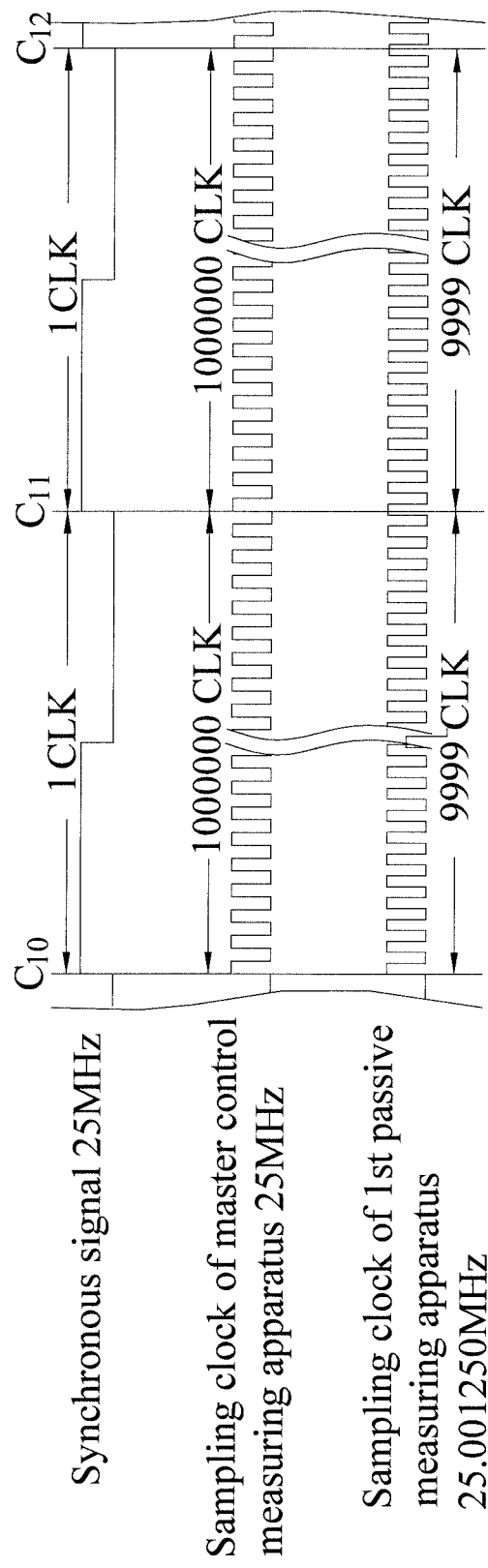
FIG. 7 is a schematic diagram of the wave form of the present invention.

Beside, between the two synchronous marks of the foresaid example, the master control measuring apparatus 21 contains 1,000,000 sampling data, and the sampling data size can be changed by changing the corresponding synchronous marks (ex. $C_1$, $C_2$, $C_3$). Therefore, by the setting of the synchronous marks, the data obtained by the slave measuring apparatus 22 can be compared with the data obtained by the master control measuring apparatus 21. Furthermore, as shown in FIG. 7, if the data differences of the master measuring apparatus 21 and the slave measuring apparatus 22 is smaller than 1 sampling data (1 CLK), the wave form reducing or elongating ratio over the master control measuring apparatus will close to 1, and the data wave form length between the two marks ($C_{10}$, $C_{11}$) can be deemed as the same. For the condition mentioned above, the data between the synchronous marks of the slave measuring apparatus can be deemed as a complete data wave form which has been synchronized.

As we can see from the sampling point set in the present example, after a long time sampling, if the wave form is not compensated, the sampling error will increase with the increasing of the time. Thus, by the setting of the sampling rate and the synchronous signal of the master control measuring apparatus 21, all the other slave measuring apparatuses 22 can have a calibration standard, and users can adjust the corresponding wave form according to the difference of the sampling rate between the master control measuring apparatus 21 and the slave measuring apparatus 22. It is also more convenient for users to perform the signal analyzing.

The advantages of the present invention are summarized as below:

1. Present invention relates to a structure or a method of data synchronization for multi measuring apparatuses. The processing platform of present invention can adjust all the data wave form length to the same.

2. Present invention can use the marks of data synchronization of all the different measuring apparatuses to adjust the wave form length, and further eliminate the sampling data difference which is caused by the clock error.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A data synchronous structure for using on multi measuring apparatuses, comprising:
 a master control measuring apparatus comprising a sampling-start signal terminal, a synchronous signal terminal, a triggering signal terminal, a signal input terminal and a connecting port, wherein the synchronous signal terminal is configured to generate a synchronous signal, the triggering signal terminal is configured to generate a triggering signal, the sampling-start signal terminal is configured to generate a sampling-start signal;
 at least one slave measuring apparatus connecting to the master control measuring apparatus, the at least one slave measuring apparatus comprising a sampling-start signal terminal, a synchronous signal terminal, a triggering signal terminal, a signal input terminal and a connecting port,
 wherein the synchronous signal terminal of the master control measuring apparatus is configured to transfer the synchronous signal to the synchronous signal terminal of the slave measuring apparatus, the triggering signal terminal of the master control measuring apparatus is configured to transfer the triggering signal to the triggering signal terminal of the slave measuring apparatus, the sampling-start signal terminal of the master control measuring apparatus is configured to transfer the sampling-start signal to the sampling-start signal terminal of the slave measuring apparatus, so that
 the slave measuring apparatus can sample the synchronous signal as a mark of data synchronization, and store the mark in the slave measuring apparatus;
 a processing platform comprising a plurality of connecting ports, wherein the master control measuring apparatus and the slave measuring apparatus are connected to the processing platform by the plurality of connecting ports of the processing platform, and the connecting port is configured to transfer a data and the mark of the master control measuring apparatus and the slave measuring apparatus to the processing platform; and
 an analyte data source connected to the signal input terminal of the master control measuring apparatus and the slave measuring apparatus, wherein the master control measuring apparatus and the slave measuring apparatus are configured to perform a data sampling.

2. The data synchronous structure according to claim 1, wherein the processing platform has a software to compare and calculate ratio of a data length between the two marks of the master control measuring apparatus and the slave measuring apparatus, the software is also configured to adjust a wave form length of the slave measuring apparatus to the same as the wave form length of the master control measuring apparatus.

3. The data synchronous structure according to claim 1, wherein the synchronous signal generated by the master measuring apparatus is configured to provide the slave measuring apparatus to perform the data synchronization, a period of the synchronous signal, wherein the period is a specific periodic square wave signal, and the period of the square wave signal is integral multiple larger than a sampling signal of the master control measuring apparatus.

4. The data synchronous structure according to claim 1, wherein the measuring apparatuses are logical analyzer, oscilloscopes, or mixed type oscilloscopes, and the measuring apparatuses are configured to connect to each other of different attribute.

5. The data synchronous structure according to claim 1, wherein the measuring apparatuses comprise a controlling/sampling data transport terminal, a clock generator, a synchronous signal input/output unit, a triggering signal input/output unit, a sampling-start signal input/output unit, a sampling unit, a synchronous/triggering tag generating unit, a memory controller, and a memory device.

6. The data synchronous structure according to claim 5, wherein the synchronous/triggering tag generating unit further comprises a timer and a data length recorder.

7. The data synchronous structure according to claim 1, wherein the data synchronous structure further comprises a hub, and the processing platform connects to all the measuring apparatuses by the hub when the amount of the connecting ports of the processing platform are smaller than the amount of the measuring apparatuses.

8. A data synchronous method for using on multi measuring apparatuses, comprising:
 (a) connecting the synchronous signal terminals of the multi measuring apparatuses to each other, wherein the measuring apparatuses connect to the processing platform to connect the synchronous signal terminal, the sampling-start signal terminal, and the triggering signal terminal of the measuring apparatuses to each other;
 (b) setting one of the measuring apparatuses as the master control measuring apparatus outputting the synchronous signal spontaneously through the software installed on the processing platform, setting other measuring apparatuses as the slave control measuring apparatus to receive the synchronous signal;
 (c) setting sampling and triggering criteria for the master control measuring apparatus by the software of the processing platform, applying the setting to a software setting of all the slave measuring apparatuses;
 (d) activating all the measuring apparatuses to start sampling until the memory device being full of the sampling data, so that the sampling process is complete;
 (e) transferring all the sampling data of the measuring apparatuses to the processing platform, accessing all the data stored in the memory device of the measuring apparatus through the processing platform; and
 (f) according to a corresponding synchronous mark, performing a data wave form length reducing-elongating sewing up calculation to all the sampling data of the measuring apparatuses to complete a sampling data synchronous after channel expending after sewing.

9. The data synchronous method according to claim 8, wherein a process of sampling and triggering criteria is:
 (a) setting the period of the synchronous signal of the master control measuring apparatus, wherein the period is integral multiple of a sampling clock, and the rate of the period is decided by the user; and
 (b) setting the signal output triggering criteria of the master control measuring apparatus.

10. The data synchronous method according to claim 8, wherein a procedure of the data wave form length reducing-elongating sewing up calculation is:
 (a) calculating the data size between the synchronous marks of all the slave measuring apparatuses through the processing platform, comparing the data between the marks of the master control measuring apparatus with all the data between the marks of all the slave measuring apparatuses to calculate the ratio;
 (b) performing reducing-elongating to the data wave form length of the slave measuring apparatus according to the ratio of all the marks through the processing platform, to fulfill a demand that the data wave form length of the slave measuring apparatus is the same as the data wave form length of the master control measuring apparatus; and (c) according to the time axis of the synchronous mark of the master control measuring apparatus, performing a linking for the wave form length of the slave measuring apparatus through the processing platform, obtaining a complete data wave form of a data synchronous processing after completing the linking process.

11. The data synchronous method according to claim 8, wherein the procedure of the data wave form length reducing-elongating sew up calculation is:

(a) calculating the data size between the synchronous marks of all the slave measuring apparatuses through the processing platform, comparing the data size between the marks of the master control measuring apparatus with the data size of between the marks of the slave measuring apparatus, calculating the ratio; and (b) by the setting of the synchronous mark, comparing the data size of the slave measuring apparatus with the data size of the master control measuring apparatus, wherein if the difference of the data size of the slave measuring apparatus and the master control measuring apparatus is within 1 sampling data, the wave form reducing-elongating ratio is close to 1, and the wave form length of the slave measuring apparatus can be deemed as the same as the master control measuring apparatus, and the corresponding data size between the synchronous marks can be deemed as a synchronization processed complete data wave form.

12. The data synchronous method according to claim 8, wherein the master control measuring apparatus have to be activated to send out the sampling-start signal, and then all slave measuring apparatuses are activated to perform the data sampling, the synchronous signal sampled by the slave measuring apparatus detecting low electric potential turning to high electric potential to generate the synchronous mark being stored in the memory device.

* * * * *